(12) United States Patent
Shamee et al.

(10) Patent No.: US 10,700,700 B1
(45) Date of Patent: Jun. 30, 2020

(54) DISTRIBUTIVE PHOTONIC MONOBIT ANALOG-TO-DIGITAL CONVERTER

(71) Applicant: Raytheon Company, Waltham, MA (US)

(72) Inventors: Bishara Shamee, Playa Del Rey, CA (US); Steven R. Wilkinson, Stevenson Ranch, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/359,234

(22) Filed: Mar. 20, 2019

(51) Int. Cl.
*H03M 1/00* (2006.01)
*H03M 3/00* (2006.01)
(Continued)

(52) U.S. Cl.
CPC .............. *H03M 3/468* (2013.01); *G02F 7/00* (2013.01); *H03M 1/001* (2013.01); *H03M 1/361* (2013.01)

(58) Field of Classification Search
CPC ...... H03M 1/56; H03M 13/41; H03M 1/1245; H03M 3/458; H03M 1/12; H03M 7/30; H03M 13/112; H03M 13/1137; H03M 13/616; H03M 13/6577; H03M 1/123; H03M 1/468; H03M 3/358; H03M 3/402; H03M 3/502; H03M 7/3026; H03M 7/3033; H03M 13/116; H04B 1/525; H04B 1/10; H04B 1/0475; H04B 1/005; H04B 1/1027; H04B 1/62; H04B 10/614; H04B 10/67;
(Continued)

(56) References Cited

U.S. PATENT DOCUMENTS 5,444,447 A 8/1995 Wingender
5,598,288 A 1/1997 Collar
(Continued)

FOREIGN PATENT DOCUMENTS

EP 2909712 A2 8/2015

OTHER PUBLICATIONS

U.S. Appl. No. 16/359,229, filed Mar. 20, 2019, Photonic Monobit Differential Analog-to-Digital Converter.
(Continued)

*Primary Examiner* — Linh V Nguyen
(74) *Attorney, Agent, or Firm* — Schwegman Lundberg & Woessner, P.A.

(57) ABSTRACT

A distributive photonic monobit analog-to-digital converter includes a plurality of signal processing chains configured to receive a corresponding plurality of analog input electrical signals. Each processing chain includes an incoherent optical source configured to generate an optical noise signal, an optical modulator configured to modulate an analog input electrical signal of the plurality of analog input electrical signals onto an input optical signal to generate an optical modulated signal, a coupler configured to couple the optical modulated signal with the optical noise signal to generate a coupled signal, a photodetector configured to generate a phase difference between the optical modulated signal and the optical noise signal using the coupled signal, and a limiter configured to output a decision signal based on the phase difference and using a clock signal. A multi-phase clock generator is configured to generate the clock signal for each of the plurality of signal processing chains.

20 Claims, 6 Drawing Sheets

(51) Int. Cl.
*G02F 7/00* (2006.01)
*H03M 1/36* (2006.01)

(58) Field of Classification Search
CPC ............ H04B 10/505; H04B 2210/006; H04B 10/2504; H04B 10/2507; H04B 10/60; H04B 10/61; H04B 10/613
USPC ........................................ 341/137, 141, 142
See application file for complete search history.

(56) References Cited

U.S. PATENT DOCUMENTS

| | | | |
|---|---|---|---|
| 6,002,480 | A | 12/1999 | Izatt et al. |
| 6,448,921 | B1 | 9/2002 | Tsui et al. |
| 6,704,511 | B1 | 3/2004 | Kerfoot, III et al. |
| 7,253,755 | B1 | 8/2007 | Fette |
| 7,406,304 | B2 * | 7/2008 | Busson ................... H04B 1/28 348/E5.108 |
| 7,423,564 | B2 | 9/2008 | Kitayama et al. |
| 7,973,688 | B2 | 7/2011 | Huang et al. |
| 8,699,882 | B2 * | 4/2014 | Shieh ................. H04L 25/0224 398/152 |
| 8,738,956 | B2 * | 5/2014 | Chen ................... H03M 1/0836 713/500 |
| 8,965,211 | B1 * | 2/2015 | Zanoni ................... H04B 10/61 341/137 |
| 9,608,653 | B2 | 3/2017 | Le Dortz et al. |
| 9,768,873 | B2 * | 9/2017 | Hajimiri ................ H04B 10/50 |
| 9,843,398 | B1 * | 12/2017 | Zanoni ................ H04B 1/0007 |
| 9,900,096 | B2 * | 2/2018 | Hajimiri ............ H04B 10/2504 |
| 10,038,498 | B1 | 7/2018 | Fan et al. |
| 10,298,256 | B1 | 5/2019 | Robinson et al. |
| 2002/0164125 | A1 * | 11/2002 | Berger ................. H04B 10/503 385/39 |
| 2003/0007215 | A1 * | 1/2003 | Snawerdt ............. H04B 10/071 398/139 |
| 2003/0025957 | A1 * | 2/2003 | Jayakumar ............. H04B 10/00 398/5 |
| 2003/0115028 | A1 | 6/2003 | Summerfield et al. |
| 2003/0198424 | A1 | 10/2003 | Bennett |
| 2004/0028414 | A1 | 2/2004 | Quesenberry et al. |
| 2006/0182209 | A1 | 8/2006 | Coyne et al. |
| 2006/0262664 | A1 | 11/2006 | Imoto |
| 2008/0031633 | A1 * | 2/2008 | Hoshida ............... H04B 10/677 398/149 |
| 2008/0205886 | A1 | 8/2008 | Anderson et al. |
| 2009/0033424 | A1 | 2/2009 | Nauta |
| 2009/0047030 | A1 * | 2/2009 | Hoshida ................. H04B 10/60 398/205 |
| 2009/0136240 | A1 | 5/2009 | Malouin et al. |
| 2010/0098411 | A1 * | 4/2010 | Nakashima ............ H04B 10/60 398/25 |
| 2011/0052216 | A1 | 3/2011 | Jiang et al. |
| 2011/0123192 | A1 * | 5/2011 | Rosenthal ............. H03M 1/121 398/43 |
| 2011/0150503 | A1 | 6/2011 | Winzer |
| 2012/0213531 | A1 * | 8/2012 | Nazarathy ............. H03M 1/145 398/202 |
| 2013/0216239 | A1 | 8/2013 | Zhang et al. |
| 2015/0154007 | A1 | 6/2015 | Sussman et al. |
| 2016/0173202 | A1 | 6/2016 | Kelly |
| 2016/0204875 | A1 * | 7/2016 | Araki ................... H04B 10/572 398/34 |
| 2016/0204876 | A1 * | 7/2016 | Kamura ............... H04J 14/0227 398/34 |
| 2017/0237500 | A1 | 8/2017 | Nishimoto |
| 2018/0006732 | A1 | 1/2018 | Pang et al. |
| 2018/0074348 | A1 | 3/2018 | Fujita et al. |
| 2018/0269964 | A1 | 9/2018 | Mertz et al. |

OTHER PUBLICATIONS

U.S. Appl. No. 16/359,248, filed Mar. 20, 2019, Wideband Photonic Radio Frequency (RF) Noise Generator.
U.S. Appl. No. 16/359,263, filed Mar. 20, 2019, Photonic Monobit Analog-to-Digital Converter Using Coherent Detection.
"U.S. Appl. No. 16/359,229, Non Final Office Action dated Sep. 30, 2019", 12 pgs.
"U.S. Appl. No. 16/359,229, Response filed Dec. 20, 2019 to Non Final Office Action dated Sep. 30, 2019", 12 pgs.
Aziz, P. M., et al., "An Overview of Sigma-Delta Converters", IEEE Signal Processing Magazine, (Jan. 1996), 61-84.
Cvetkovic, Zoran, et al., "Single-Bit Oversampled A/D Conversion With Exponential Accuracy in the Bit Rate", IEEE Transactions on Information Theory, vol. 53, No. 11, (2007), 3979-3989.
Dabeer, Onkar, et al., "Signal Parameter Estimation Using 1-Bit Dithered Quantization", IEEE Transactions on Information Theory, vol. 52, No. 12, (Dec. 2006), 5389-5405.
Qi, Bing, et al., "High-speed quantum random number generation by measuring phase noise of a single-mode laser", Optics Letters / vol. 35, No. 3, (Feb. 2010), 312-314.
Roberts, Lawrence, "Picture Coding Using Pseudo-Random Noise", IRE Transactions on Information Theory, (1962), 145-154.
Rodenbeck, Christopher, et al., "Monobit Subsampler for Digital Downconversion in Pulse-Doppler Radar Applications", IEEE Transactions on Microwave Theory and Techniques, vol. 57, No. 5, (2009), 1036-1043.
Sinem, Ergen, et al., "Effect of Analog-to Digital Converter in Distributed Sampling for Sensor Networks", (2005), 8 pgs.
Valley, George C, "Photonic analog-to-digital converters", Optics Express, vol. 15, No. 5, [Online] Retrieved from the Internet: <https://pdfs.semanticscholar.org/a868/e2d948b01cef975868088cf23flf0c2041f2.pdf>, (2007), 28 pgs.
Wang, Zhiyong, et al., "Monobit Digital Receivers for QPSK: Design, Performance and Impact of IQ Imbalances", arXiv:1202.6141v3 [cs.IT], (2013), 29 pgs.
Wannamaker, Rob, "A theory of Non-Subtractive Dither", IEEE Transactions on Signal Processing 48(2):499-516, (2000), 56 pgs.
Deshpande, "Electron Devices and Circuits: Principles and Applications", Tata McGraw-Hill Education, (2008), 125-126.
Kakande, "QPSK Phase and Amplitude Regeneration at 56 Gbaud in a Novel Idler-Free Non-Degenerate Phase Sensitive Amplifier", OSA, (2011), 3 pgs.
Kaminov, "Optical Fiber Telecommunications vol. VIB: Systems and Network", Academic Press, (2013), 932-934.
"U.S. Appl. No. 16/359,229, Notice of Allowability dated May 1, 2020", 2 pgs.
"U.S. Appl. No. 16/359,229, Notice of Allowance dated Mar. 13, 2020", 9 pgs.
"U.S. Appl. No. 16/359,263, Non Final Office Action dated Feb. 18, 2020", 22 pgs.
"White Noise", Wikipedia (2017).
Deshpande, "Electron Devices & Circuits: Principles and Applications", Tata McGraw-Hill Education, (2008), 125-126.
Kakande, et al., "QPSK Phase and Amplitude Regeneration at 56 Gbaud in a Novel Idler-Free Non-Degenerate Phase Sensitive Amplifier", OSA, (2011), 3 pgs.
Kaminov, et al., "Optical Fiber Telecommunications vol. VIB: Systems and Network", Academic Press, (2013), 932-934.

\* cited by examiner

US 10,700,700 B1

DISTRIBUTIVE PHOTONIC MONOBIT ANALOG-TO-DIGITAL CONVERTER

TECHNICAL FIELD OF THE DISCLOSURE

The present disclosure relates to analog-to-digital converters (ADCs). More specifically, the present disclosure relates to distributive photonic monobit ADCs, such as photonic monobit ADCs using coherent or balanced detection.

BACKGROUND OF THE DISCLOSURE

As communication systems evolve over time, digital data rates tend to increase. As a result, there is an ongoing effort to increase the speed and accuracy of analog-to-digital conversion to support the increase in communication rates.

High bandwidth and high spur-free dynamic range analog-to-digital conversion is a common desire across multiple domains but is difficult to achieve. With the advent of photonics, the analog-to-digital conversion can be improved beyond the electronic conversion by harvesting the photonics bandwidth and balancing the functional partition between electronics and photonics.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting the scope of the invention in any manner.

DETAILED DESCRIPTION

The following description and the drawings sufficiently illustrate aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Figure 3:
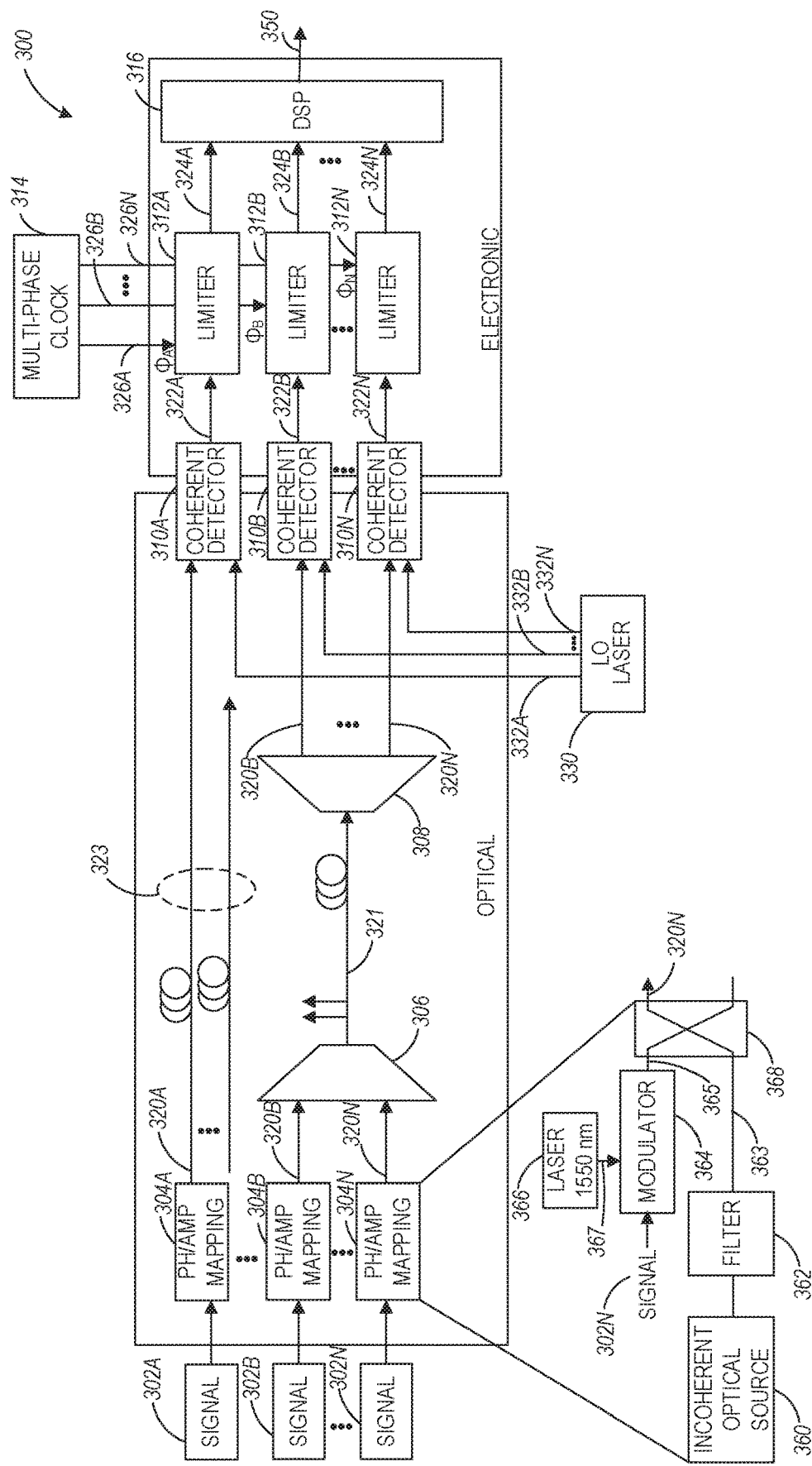
FIG. 3 is a block diagram of a distributive photonic monobit ADC using coherent detection, in accordance with some aspects.
Figure 4:
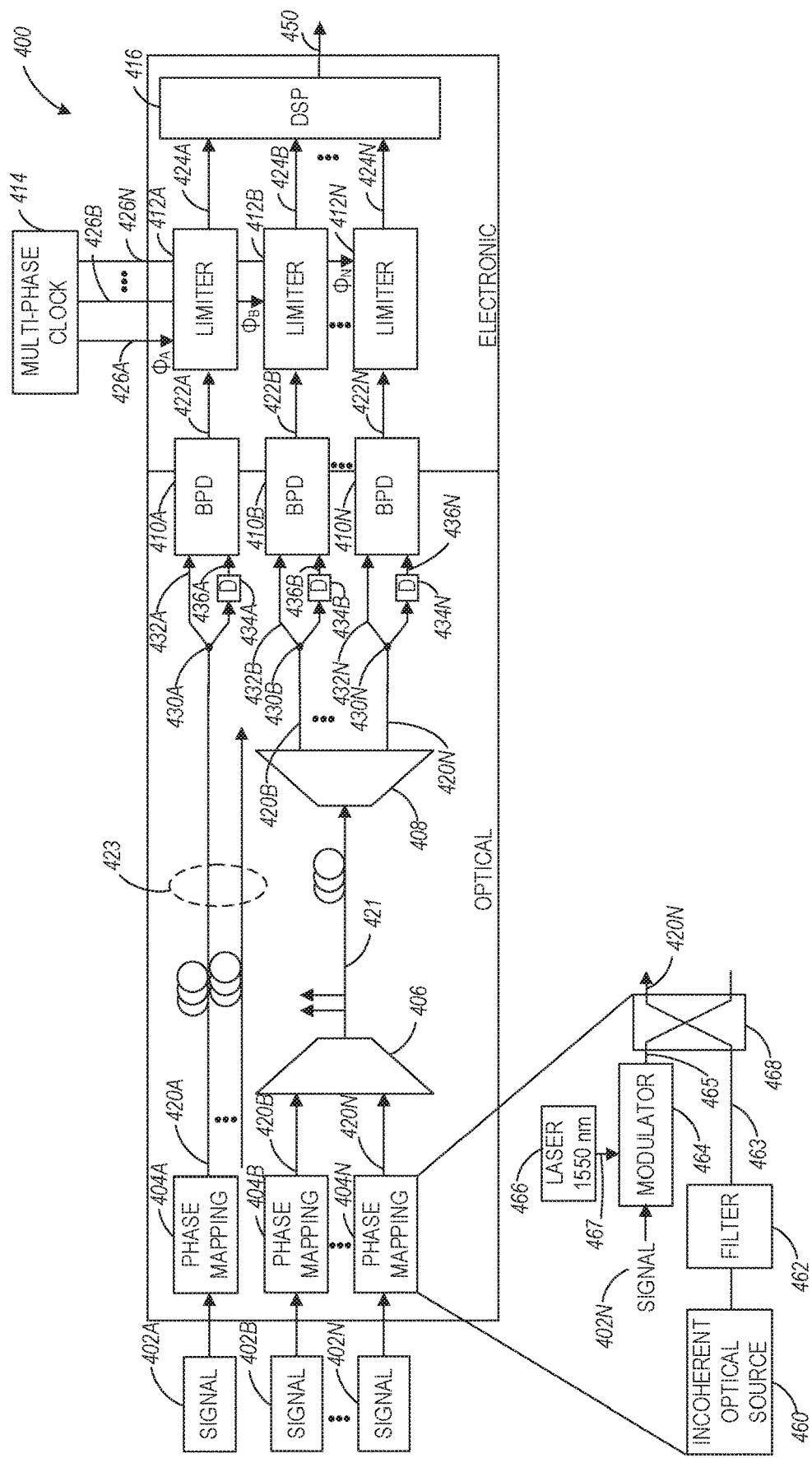
FIG. 4 is a block diagram of a distributive photonic monobit ADC using balanced photodetectors, in accordance with some aspects.

Techniques disclosed herein can be used to realize a photonic ADC with high spur-free dynamic range (SFDR) based on a monobit concept, such as dithering an input signal with uniform noise. Furthermore, techniques disclosed herein can use distributive analog-to-digital conversion where multiple remote RF signals are sampled, and after photonic monobit conversion, are multiplexed and transmitted via an optical medium. In this regard, an optical waveform can be transmitted over a large distance to a digital signal processing location. At the digital signal processing location, the optical signal can be demultiplexed and quantized using a monobit architecture with controlled relative timing. In some aspects, coherent detection or balanced photodetection can be used to process the optical signals after demultiplexing at the digital signal processing location, as illustrated in FIGS. 3-4.

Figure 1:
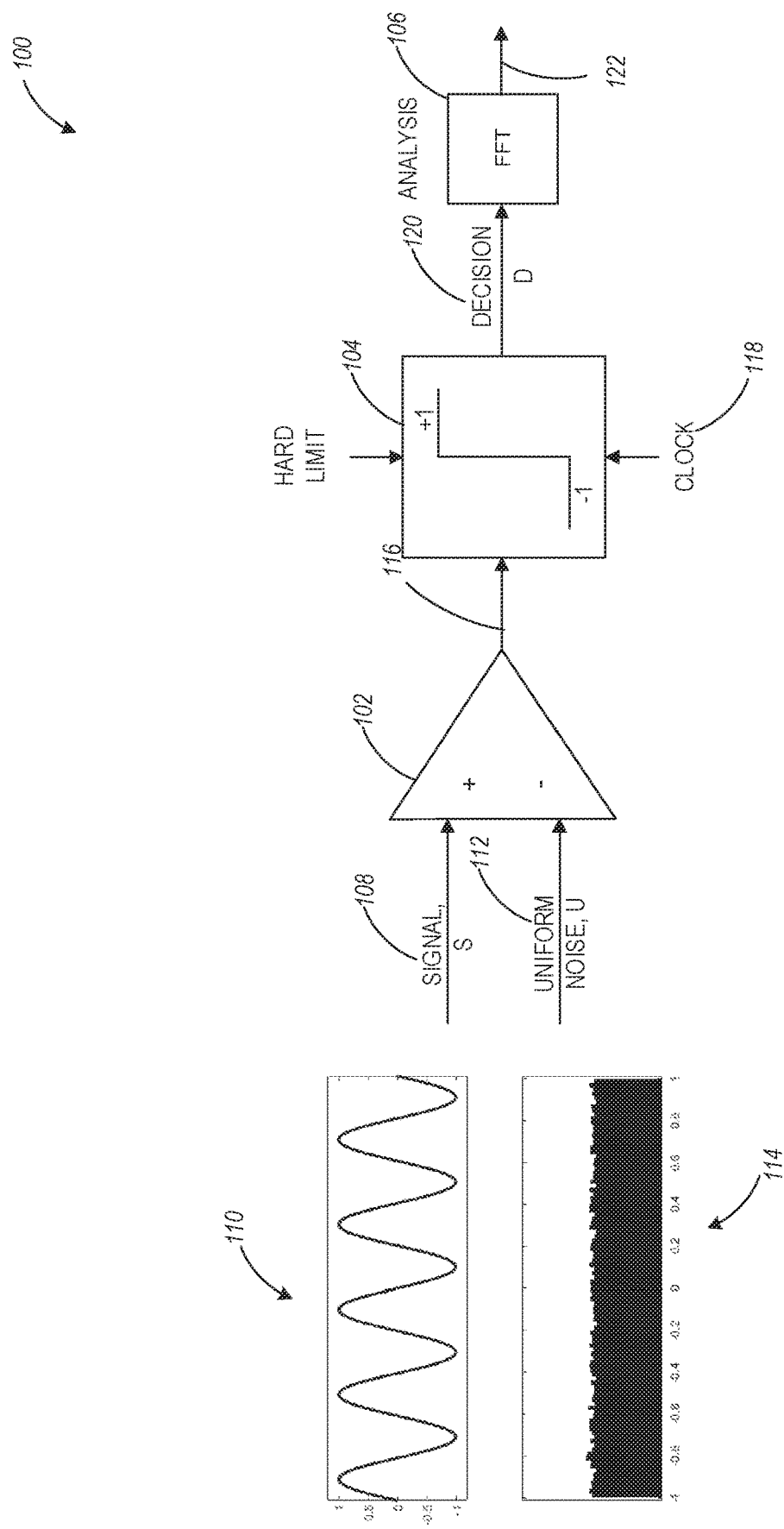
FIG. 1 illustrates a conceptual block diagram of a monobit ADC, in accordance with some aspects.

FIG. 1 illustrates a conceptual block diagram of a monobit ADC 100, in accordance with some aspects. Electronic monobit ADCs convert an analog signal to its digital representation based on dithering an input signal with uniform noise. Referring to FIG. 1, the monobit ADC 100 can include a comparator 102 and a limiter 104. The comparator 102 is configured to receive an analog input signal (S) 108 and a uniform noise signal (U) 112. The analog input signal 108 can have a signal profile as illustrated in graph 110, and the uniform noise signal 112 can have a noise distribution as illustrated in graph 114.

The comparator 102 compares the analog input signal 108 with the uniform noise signal 112 to generate a comparison result 116. The limiter 104 is configured to receive a clock signal 118 and the comparison result 116, and hard limit the comparison result to +1 (if the signal is greater than the noise) or −1 (if the noise is greater than the signal). The limiter 104 outputs a decision signal (D) 120, with the expected value (or average) of the decision signal D 120 being a digital signal representation 122 of the analog input signal 108, after processing with a filter (e.g., in a digital signal processing block or a Fourier frequency transform (FFT) block such as FFT block 106).

One of the main limitations of analog-to-digital conversion at higher rates is the introduced spurs of undesired tones resulting from realization imperfections. A significant advantage of the monobit ADC architecture is the high SFDR resulting from the dithering (or applying uniform noise to) the input signal.

Figure 2:
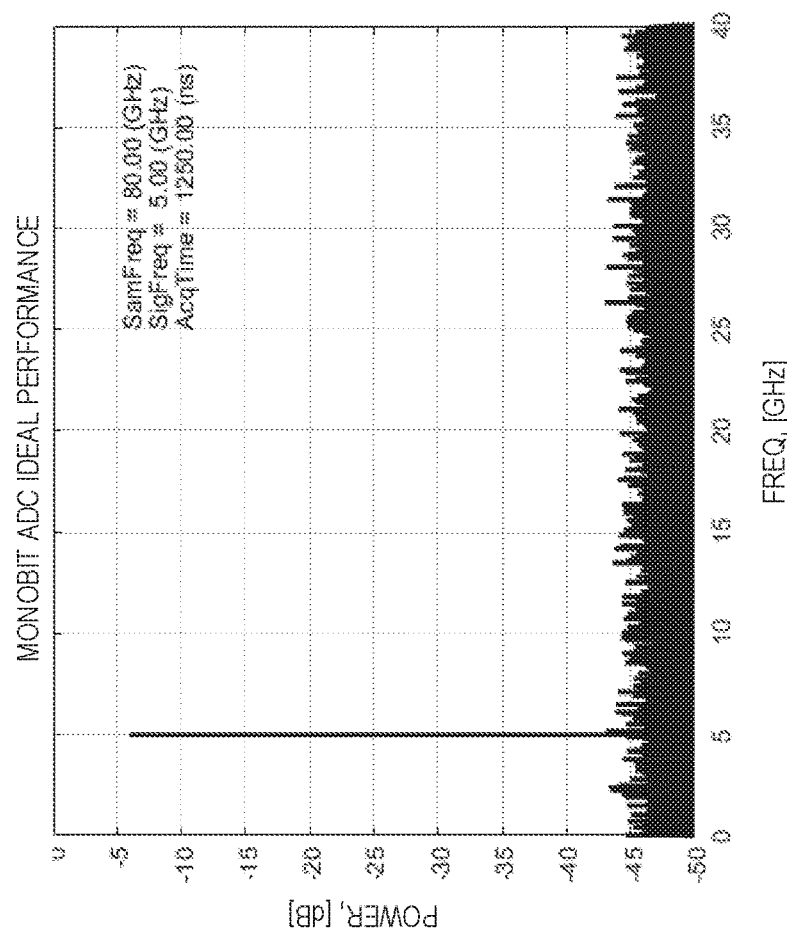
FIG. 2 is a graphical representation illustrating a frequency Fourier transform (FFT) magnitude of a tone based on the monobit ADC of FIG. 1.

FIG. 2 is a graphical representation 200 illustrating a frequency Fourier transform (FFT) magnitude of a tone based on the monobit ADC 100 of FIG. 1. FIG. 2 is illustrative of the spur free range of monobit conversion. More specifically, FIG. 2 illustrates the frequency and power profile of a tone at 5 GHz that is sampled at 80 GHz with an acquisition time of 1.25 µs. The spurs appear relatively at the same power level as illustrated by the FFT of the limiter output.

Some techniques for implementing electronic monobit conversion can rely on generating digital pseudo-random noise, which can consume a large portion of the ASIC power and can be a limiting factor as the sampling rates increase. One of the advantages of photonics is its bandwidth and relative efficiency. In this regard, techniques disclosed herein can be used to realize a photonic monobit ADC, based on a modulator that modulates the electrical signal onto an optical carrier to be compared with an incoherent wide bandwidth noise source, as discussed hereinbelow.

FIG. 3 is a block diagram of a distributive photonic monobit ADC using coherent detection, in accordance with some aspects. Referring to FIG. 3, the distributive photonic monobit ADC 300 can include a plurality of signal processing chains, where each processing chain can include a mapping circuit (e.g., one of 304A, 304B, . . . , 304N) receiving a corresponding input signal (e.g., one of 302A, 302B, . . . , 302N), a coherent detector (e.g., one of 310A, 310B, . . . , 310N), and a limiter (e.g., one of 312A, 312B, . . . , 312N). The distributive photonic monobit ADC 300 further includes a multiplexer 306, a demultiplexer 308, a matching local oscillator (LO) laser 330, a multi-phase clock generator 314, and a digital signal processor (DSP) 316.

In some aspects, the input signals 302A, . . . , 302N can be complex baseband signals that can be received from a sensor network (not illustrated in FIG. 3).

Figure 5:
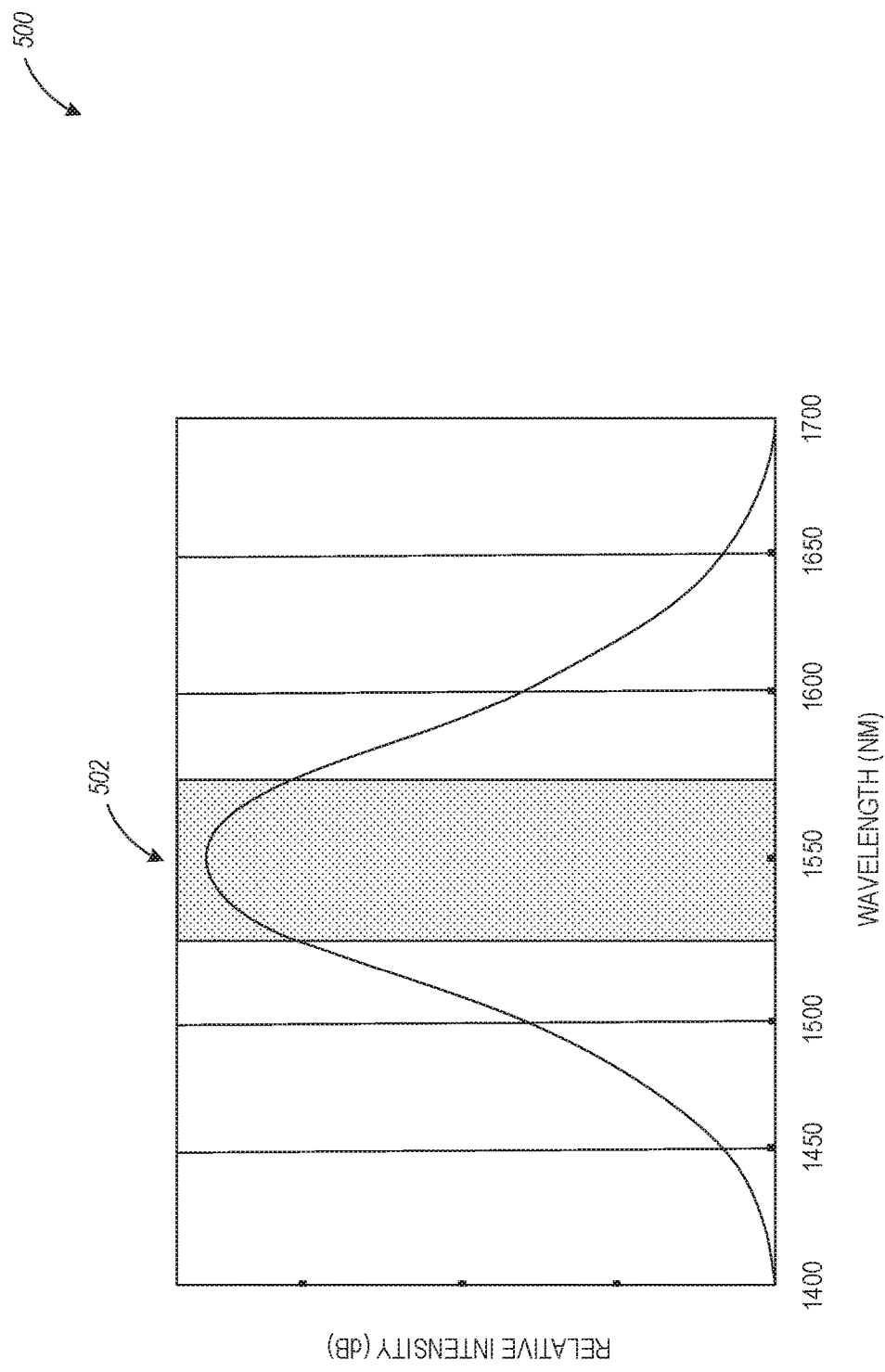
FIG. 5 is a graphical spectral representation of a noise signal from an incoherent optical source which can be used in connection with the ADC of FIG. 3 or the ADC of FIG. 4.

The mapping circuit 304N (as well as any of the remaining mapping circuits from the plurality of mapping circuits 304A, . . . , 304N) can include an optical source 360, a filter 362, a modulator 364, an optical signal generator 366, and a coupler 368. The optical source 360 can be an incoherent optical signal source generating an optical or photonic noise signal, where the signal phases are random and uniformly distributed over the range of the signal, from sample to sample, with low correlation existing between any two instants. FIG. 5 is a graphical spectral representation 500 of a noise signal (e.g., the output of the incoherent optical source 360) used in connection with the distributive photonic monobit ADC 300. In some aspects, the optical source 360 can be an incoherent white light emitting diode (LED) source with high bandwidth, such as a bandwidth exceeding 1 THz, or an amplified spontaneous emissions (ASE) light source, or another type of optical noise source. As illustrated in FIG. 5, the noise signal at the output of the optical source 360 can be filtered so that a limited slice (e.g., 502) can be selected for dithering with another optical signal within the mapping circuit 304N.

The filter 362 can be configured to filter the optical noise signal generated by the incoherent optical source 360, to obtain an optical filtered noise signal 363. In some aspects, the filter 362 can be a 1 nm filter that can be configured to generate a 125 GHz optical noise signal slice with a random phase samples. In some aspects, the optical filtered noise signal 363 can be centered at 1550 nm wavelength as shown in FIG. 5, or it can be centered at another wavelength.

The modulator 364 may comprise suitable circuitry, logic, interfaces and/or code and is configured to receive an input optical signal 367 from the optical signal generator 366 and an input complex baseband signal (e.g., 302N), to generate an optical modulated signal 365. The input complex baseband signal 3302N can include an in-phase (I) signal component and a quadrature (Q) signal component. In some aspects, the optical signal generator 366 can be a laser signal generator and the input optical signal 367 can be a laser signal. In some aspects, the optical signal generator 366 can be a 1550 nm laser or another wavelength laser. The modulator 364 can be a dual optical modulator configured to phase and/or amplitude modulate the input complex baseband signal 302N onto the input optical signal 367 to generate the optical modulated signal 365 (i.e., the phase and/or amplitude of the optical modulated signal 365 correspond to the signal phase and/or amplitude of the input complex baseband signal 302N). In some aspects, the modulator 364 can include a dual Mach-Zehnder modulator (MZM) that can be used in place of a phase modulator, which can further contribute to improving the effectiveness of the distributive photonic monobit ADC 300 by removing the harmonics inherent in the phase modulation process.

The coupler 368 is configured to couple the optical modulated signal 365 and the optical filtered noise signal 363 from the incoherent optical source 360 and the filter 362, to generate an optical coupled signal 320N (e.g., appearing at the upper arm of the coupler 368 in FIG. 3, with the lower arm of the coupler not being used).

Even though FIG. 3 illustrates a more detailed diagram of only the mapping circuit 304N, the remaining mapping circuits can use similar processing techniques to generate the remaining optical coupled signals 320A, 320B, . . . 320N. As used herein, the optical coupled signals 320A, . . . , 320N can also be referred to as dithered optical signals (or dithered signals) 320A, . . . , 320N.

In some aspects, two or more of the coupled signals (e.g., coupled signals 320B, . . . , 320N) can be multiplexed via the multiplexer 306 onto an optical transmission line 321 using wave division multiplexing (WDM), dense wave division multiplexing (DWDM), or another multiplexing technique. By multiplexing the coupled signals near the signal source and transmitting an optical multiplexed signal for quantization near the destination site, processing resources can be used more efficiently and the greater distances with minimal signal loss.

Even though FIG. 3 illustrates the mapping circuit 304A outputting a single coupled signal 320A communicated via a single fiber line to the coherent detector 310A, the disclosure is not limited in this regard. More specifically, a plurality of coupled signals (including coupled signal 320A as well as one or more other coupled signals) can be communicated via a corresponding plurality of single fiber lines 323 to a corresponding plurality of coherent detectors for processing and quantization.

The multiplexed signal can be demultiplexed via demultiplexer 308 near the destination site where coherent detection and quantization can be performed. Each of the coherent detectors 310A, . . . , 310N comprise suitable circuitry, logic, interfaces and/or code, and is configured to perform coherent detection of I and Q signal components within the optical coupled signals 320A, . . . , 320N recovered from the demultiplexer 308. In some aspects, each of the coherent detectors 310A, . . . , 310N can include a hybrid circuit (e.g., a plurality of couplers) followed by a balanced photodetector. Each of the coherent detectors 310A, . . . , 310N is configured to receive a corresponding reference optical signal 332A, . . . , 332N from the LO laser 330 and a corresponding optical coupled signal 320A, . . . , 320N, and coherently detect a dithered I signal component and a dithered Q signal component (collectively, 322A, . . . , 322N) corresponding to the input complex baseband signals 302A, . . . , 302N. More specifically, each of the coherent detectors 310A, . . . , 310N can perform coherent detection of the I and Q signal components 322A, . . . , 322N within the optical coupled signals 320A, . . . , 320N using the reference optical signals 332A, . . . , 332N.

The limiters 312A, . . . , 312N may comprise suitable circuitry, logic, interfaces, and/or code and are configured to receive the dithered I and Q signal components 322A, . . . , 322N, respectively, and generate a corresponding complex decision signal 324A, . . . , 324N (with each decision signal including an I decision signal component and a Q decision signal component) corresponding to the sign of the received signal components 322A, . . . 322N and based on the corresponding clock signals 326A, . . . , 326N generated by the multi-phase clock generator 314. In this regard, the limiters 312A, . . . , 312N are threshold devices that limit the input signal to either +1 (if the input is positive) or −1 (if the input is negative), with the clock signal triggering when the comparison occurs. The triggers can occur at the clock rate, which corresponds to the sample rate of an ADC. The mechanism of the trigger can be but is not limited to, zero-crossing for the clock, a rising edge, or a falling edge of a clock signal. The complex decision signals 324A, . . . 324N can be further processed (e.g., by filtering, signal reconstruction, and/or other signal processing) performed by the DSP 316, to generate an output digital signal 350 representative of the input complex baseband signals 302A, . . . , 302N.

FIG. 4 is a block diagram of a distributive photonic monobit ADC using balanced photodetectors, in accordance with some aspects. Referring to FIG. 4, the distributive photonic monobit ADC 400 can include a plurality of signal processing chains, where each processing chain can include a phase mapping circuit (e.g., one of 404A, 404B, . . . , 404N) receiving a corresponding analog input signal (e.g., one of 402A, 402B, . . . , 402N), a balanced photodetector (BPD) (e.g., one of 410A, 410B, . . . , 410N), and a limiter (e.g., one of 412A, 412B, . . . , 412N). The distributive photonic monobit ADC 400 further includes a multiplexer 406, a demultiplexer 408, splitters 430A, . . . , 430N, delay circuits 434A, . . . , 434N, a multi-phase clock generator 414, and a digital signal processor (DSP) 416. In some aspects, the analog input signals 402A, . . . , 402N can be received from a sensor network (not illustrated in FIG. 4).

The phase mapping circuit 404N can include an optical source 460, a filter 462, a modulator 464, an optical signal generator 466, and a coupler 468. The optical source 460 can be an incoherent optical signal source generating an optical or photonic noise signal, where the signal phases are random and uniformly distributed over the range of the signal, from sample to sample, with low correlation existing between any two instants. FIG. 5 is a graphical spectral representation 500 of a noise signal (e.g., the output of the incoherent optical source 460) used in connection with the distributive photonic monobit ADC 300. In some aspects, the optical source 460 can be an incoherent white light emitting diode (LED) source with high bandwidth, such as a bandwidth exceeding 1 THz, or an amplified spontaneous emissions (ASE) light source, or another type of optical noise source. As illustrated in FIG. 5, the noise signal at the output of the optical source 460 can be filtered so that a limited slice (e.g., 502) can be selected for dithering with another optical signal within the phase mapping circuit 404N.

The filter 462 can be configured to filter the optical noise signal generated by the incoherent optical source 460, to obtain an optical filtered noise signal 463. In some aspects, the filter 462 can be a 1 nm filter that can be configured to generate a 125 GHz optical noise signal slice with a random phase samples. In some aspects, the optical filtered noise signal 463 can be centered at 1550 nm wavelength as shown in FIG. 5, or it can be centered at another wavelength.

The phase modulator 464 may comprise suitable circuitry, logic, interfaces and/or code and is configured to receive an input optical signal 467 from the optical signal generator 466 and an analog input signal (e.g., 402N), to generate an optical modulated signal 465. In some aspects, the optical signal generator 466 can be a laser signal generator and the input optical signal 467 can be a laser signal. In some aspects, the optical signal generator 466 can be a 1550 nm laser or another wavelength laser. The phase modulator 464 can be configured to phase modulate the analog input signal 402N onto the input optical signal 467 to generate the optical modulated signal 465 (i.e., the phase of the optical modulated signal 465 corresponds to the signal phase of the input analog signal 402N).

The coupler 468 is configured to couple the optical modulated signal 465 and the optical filtered noise signal 463 from the incoherent optical source 460 and the filter 462, to generate an optical coupled signal 420N (e.g., appearing at the upper arm of the coupler 468 in FIG. 4, with the lower arm of the coupler not being used).

Even though FIG. 4 illustrates a more detailed diagram of only the phase mapping circuit 404N, the remaining phase mapping circuits can use similar processing techniques to generate the remaining optical coupled signals 420A, 420B, . . . ). As used herein, the optical coupled signals 420A, . . . , 420N can also be referred to as dithered optical signals (or dithered signals) 420A, . . . , 420N.

In some aspects, two or more of the coupled signals (e.g., coupled signals 420B, . . . , 420N) can be multiplexed via the multiplexer 406 onto an optical transmission line 421 using wave division multiplexing (WDM), dense wave division multiplexing (DWDM), or another multiplexing technique. By multiplexing the coupled signals near the signal source and transmitting an optical multiplexed signal for quantization near the destination site, processing resources can be used more efficiently and the greater distances with minimal signal loss.

The multiplexed signal can be demultiplexed via demultiplexer 408 near the destination site where direct detection and quantization can be performed. The recovered optical coupled signals 420A, . . . , 420N are split by corresponding splitters 430A, . . . , 430N, with a first version of the optical coupled signals 432A, . . . , 432N (i.e., a first coupled signal) being communicated as input into the corresponding BPDs 410A, . . . , 410N, while a second version of the coupled signals (i.e., a second coupled signal) is delayed by corresponding delay circuits 434A, . . . , 434N to generate delayed coupled signals 436A, . . . , 436N. The delayed coupled signals 436A, . . . , 436N are communicated as second inputs to the BPDs 410A, . . . , 410N.

Even though FIG. 4 illustrates the mapping circuit 404A outputting a single coupled signal 420A communicated via a single fiber line to the splitter 430A, the disclosure is not limited in this regard. More specifically, a plurality of coupled signals (including coupled signal 420A as well as one or more other coupled signals) can be communicated via a corresponding plurality of single fiber lines 423 to a corresponding plurality of splitters (including splitter 430A) for processing by BPDs and subsequent quantization.

The BPDs 410A, . . . , 410N may comprise suitable circuitry, logic, interfaces, and/or code and are configured to generate corresponding electrical output signals 422A, . . . , 422N indicative of a phase difference between the optical modulated signal (e.g., 465) and the filtered noise signal (e.g., 463) within each of the signal processing chains.

The limiters 412A, . . . , 412N are configured to receive the electrical output signals 422A, . . . , 422N and corresponding electrical clock signals 426A, . . . , 426N generated by the clock generator 414, and generate corresponding decision signals 424A, . . . , 424N corresponding to the analog input signals 402A, . . . , 402N, based on the electrical output signals 422A, . . . , 422N from the BPDs 410A, . . . , 410N. In this regard, the limiters 412A, . . . , 412N are threshold devices that limit the input signal to either +1 (if the input is positive) or −1 (if the input is negative), with the clock signal triggering when the comparison occurs. The triggers can occur at the clock rate, which corresponds to the sample rate of an ADC. The mechanism of the trigger can be, but not limited to, zero-crossing for the clock, a rising edge, or a falling edge of a clock signal. The decision signals 424A, . . . , 424N can be further processed (e.g., by filtering, signal reconstruction, and/or other signal processing) performed by the DSP module 416, to generate an output digital signal 450. In some aspects, the clock signals 426A, . . . , 426N generated by the clock generator 414 can have different phases (e.g., $\Phi_A, \Phi_B, \ldots, \Phi_N$).

Figure 6:
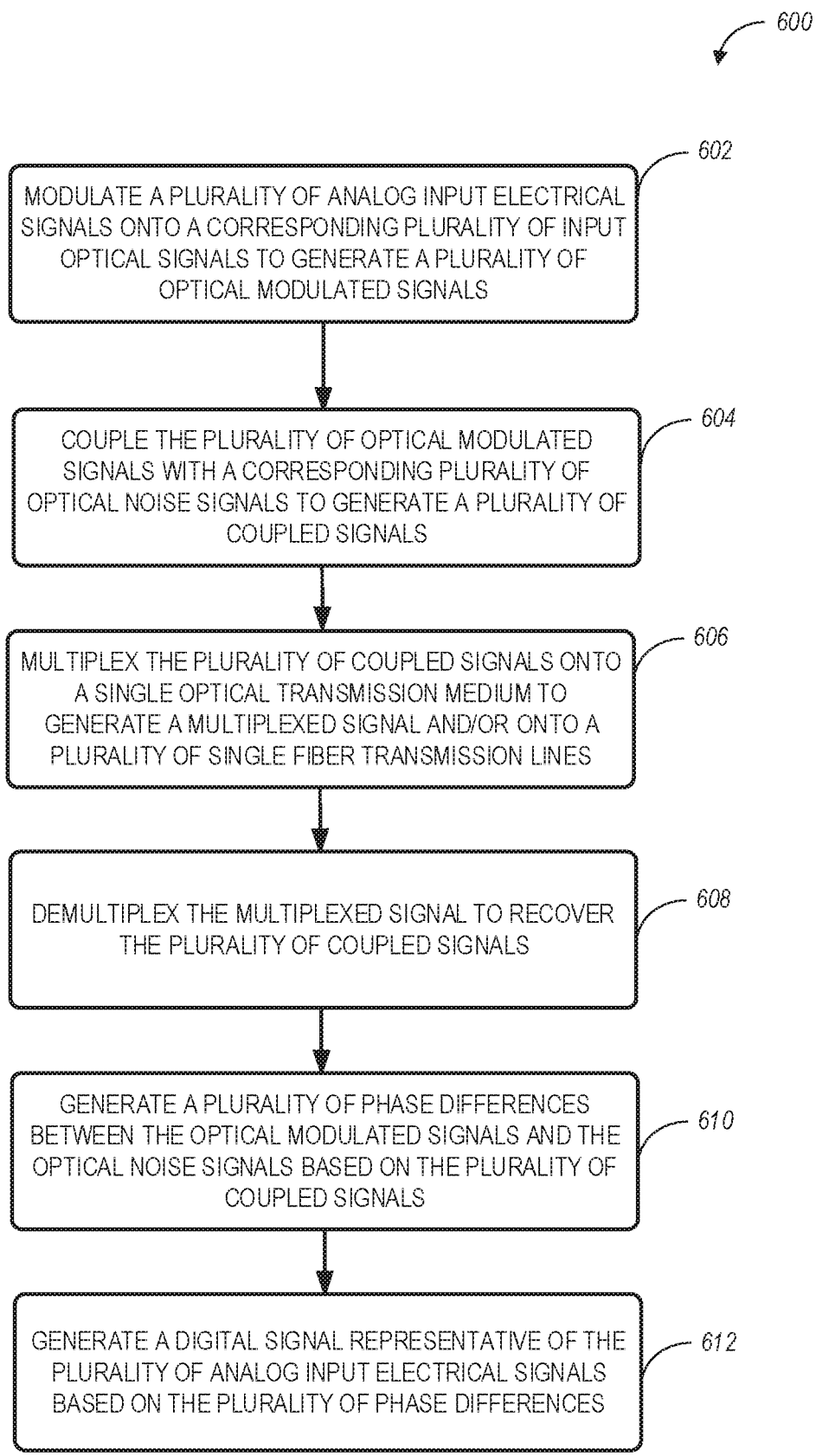
FIG. 6 illustrates generally a flowchart of example functionalities which can be performed in connection with analog-to-digital conversion, in accordance with some aspects.

FIG. 6 illustrates generally a flowchart of example functionalities which can be performed in connection with analog-to-digital conversion, in accordance with some aspects. Referring to FIG. 6, the method 600 includes operations 602, 604, 606, 608, 610, and 612. By way of example and not limitation, method 600 is described as being performed by one or more of the components of the distributive photonic monobit ADC 400 of FIG. 4 and 300 of FIG. 3. At operation 602, analog input electrical signals are modulated onto a corresponding plurality of input optical signals to generate a plurality of optical modulated signals. For example, the analog input electrical signals 402A, . . . , 402N are modulated by corresponding modulators (e.g., modulator 464 modulating signal 402N) onto a plurality of optical signals (e.g., a signal similar to optical signal 467 generated by optical signal source 466).

At operation 604, the optical modulated signals are coupled with a corresponding plurality of optical noise signals to generate a plurality of coupled signals. For example and in reference to the phase mapping circuit 404N, the optical modulated signal 465 is coupled by coupler 468 with the filtered optical noise signal 463 to generate a coupled signal 420N. In this regard, phase mapping circuits 404A, . . . , 404N generate a corresponding plurality of coupled signals 420A, . . . , 420N.

At operation 606, the coupled signals are multiplexed onto a single optical transmission medium to generate a multiplexed signal and/or a portion (or all) coupled signals are transmitted via single fiber transmission lines. For example, coupled signals 420B, . . . , 420N are multiplexed by multiplexer 406 onto a single optical transmission medium 421. In some aspects, the multiplexed signals can be transmitted via the optical transmission line 421 along with a plurality of coupled signals transmitted via a corresponding plurality of single fiber lines 423.

At operation 608, the multiplexed signal is demultiplexed to recover the plurality of coupled signals, which can be received along with other coupled signals transmitted via the plurality of single fiber lines 423. For example, demultiplexer 408 the multiplexes and recovers the coupled signals. All coupled signals 420A, . . . , 420N are then communicated to corresponding splitters 430A, . . . , 430N. At operation 610, phase differences are generated between the optical modulated signals and the optical noise signals based on the plurality of coupled signals. For example, after the couple signals are recovered, they are split by the corresponding splitters (e.g., 430A, . . . , 430N), with one of the signal copies being delayed by corresponding delay circuits 434A, . . . , 434N. The delayed and non-delayed versions of the couple signals are communicated to corresponding BPDs 410A, . . . , 410N, which generate output signals 422A, . . . , 422N indicative of phase differences between the optical modulated signals and the optical noise signals. At operation 612, a digital signal representative of the plurality of analog input electrical signals is generated based on the plurality of phase differences. For example, the limiters 412A, . . . , 412N generate a plurality of decision signals 424A, . . . , 424N based on the output signals 422A, . . . , 422N, and the DSP 416 generates digital signal 450 based on the plurality of decision signals 424A, . . . , 424N.

Although an aspect has been described with reference to specific exemplary aspects, it will be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

Such aspects of the inventive subject matter may be referred to herein, individually or collectively, merely for convenience and without intending to voluntarily limit the scope of this application to any single aspect or inventive concept if more than one is in fact disclosed. Thus, although specific aspects have been illustrated and described herein, it should be appreciated that any arrangement calculated to achieve the same purpose may be substituted for the specific aspects shown. This disclosure is intended to cover any and all adaptations or variations of various aspects. Combinations of the above aspects and other aspects not specifically described herein will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus, the following claims are hereby incorporated into the Detailed Description, with each claim standing on its own as a separate aspect.

What is claimed is:

1. A distributive photonic monobit analog-to-digital converter, comprising:
 a plurality of signal processing chains configured to receive a corresponding plurality of analog input electrical signals, wherein each processing chain of the plurality of signal processing chains comprises:
  an optical source configured to generate an optical noise signal, the optical noise signal comprising random signal phases that are uniformly distributed over a pre-determined range of the optical noise signal;
  an optical modulator configured to modulate an analog input electrical signal of the plurality of analog input electrical signals onto an input optical signal to generate an optical modulated signal;
  a coupler configured to couple the optical modulated signal with the optical noise signal to generate a coupled signal, the coupled signal having a spur free dynamic range (SFDR) based on the uniformly distributed random signal phases of the optical noise signal;
  a photodetector configured to generate a phase difference between the optical modulated signal and the optical noise signal using the coupled signal; and
  a limiter configured to output a decision signal based on the phase difference and using a clock signal;

a multi-phase clock generator configured to generate the clock signal for each of the plurality of signal processing chains; and a digital signal processing (DSP) circuit configured to generate a digital signal representative of the plurality of analog input electrical signal based on the decision signal from each of the plurality of signal processing chains.

2. A distributive photonic monobit analog-to-digital converter, comprising:

a plurality of signal processing chains configured to receive a corresponding plurality of analog input electrical signals, wherein each processing chain of the plurality of signal processing chains comprises:
  an optical source configured to generate an optical noise signal;
  an optical modulator configured to modulate an analog input electrical signal of the plurality of analog input electrical signals onto an input optical signal to generate an optical modulated signal;
  a coupler configured to couple the optical modulated signal with the optical noise signal to generate a coupled signal;
  a photodetector configured to generate a phase difference between the optical modulated signal and the optical noise signal using the coupled signal; and
  a limiter configured to output a decision signal based on the phase difference and using a clock signal;
a multiplexer configured to multiplex a first plurality of the coupled signals from the couplers in the plurality of signal processing chains onto a single optical transmission medium using Wave Division Multiplexing (WDM) or Dense Wave Division Multiplexing (DWDM); and
a plurality of single transmission lines for transmitting a remaining, second plurality of the coupled signals;
a multi-phase clock generator configured to generate the clock signal for each of the plurality of signal processing chains; and
a digital signal processing (DSP) circuit configured to generate a digital signal representative of the plurality of analog input electrical signal based on the decision signal from each of the plurality of signal processing chains.

3. The distributive photonic monobit analog-to-digital converter of claim 2, further comprising:
a demultiplexer configured to demultiplex the first plurality of the coupled signals received via the single optical transmission medium.

4. The distributive photonic monobit analog-to-digital converter of claim 1, wherein each processing chain of the plurality of signal processing chains further comprises:
  a splitter configured to split the coupled signal to generate a first coupled signal and a second coupled signal; and
  a delay circuit configured to generate a delayed coupled signal using the second coupled signal.

5. The distributive photonic monobit analog-to-digital converter of claim 4, wherein the photodetector is configured to generate the phase difference between the optical modulated signal and the optical noise signal using the first coupled signal and the delayed coupled signal.

6. The distributive photonic monobit analog-to-digital converter of claim 1, wherein the optical source is a white light emitting diode (LED) source or an amplified spontaneous emissions (ASE) light source with a bandwidth exceeding 1 THz.

7. The distributive photonic monobit analog-to-digital converter of claim 6, further comprising:
  a filter configured to generate a filtered optical noise signal using the optical noise signal, wherein the generated phase difference is between the optical modulated signal and the filtered optical noise signal.

8. The distributive photonic monobit analog-to-digital converter of claim 7, wherein the filtered optical noise signal comprises a bandwidth exceeding a bandwidth of the plurality of analog input electrical signals.

9. The distributive photonic monobit analog-to-digital converter of claim 1, wherein the optical modulator is a phase modulator configured to phase modulate the analog input electrical signal onto the input optical signal to generate the optical modulated signal.

10. The distributive photonic monobit analog-to-digital converter of claim 1, further comprising:
  a laser light source configured to generate the input optical signal,
  wherein the laser light source is a 1550 nm laser light source or a light source of a pre-configured wavelength that is different from 1550 nm.

11. A method for generating a digital signal representative of a plurality of analog input electrical signals, the method comprising:
  modulating the plurality of analog input electrical signals onto a corresponding plurality of input optical signals to generate a plurality of optical modulated signals;
  coupling the plurality of optical modulated signals with a corresponding plurality of optical noise signals to generate a plurality of coupled signals;
  multiplexing a first portion of the plurality of coupled signals onto a single optical transmission medium to generate a multiplexed signal for transmission along with a remaining, second portion of the plurality of coupled signals via a corresponding plurality of single fiber lines;
  demultiplexing the multiplexed signal to recover the first portion of the plurality of coupled signals, received along with the second portion of the plurality of coupled signals;
  generating a plurality of phase differences between the optical modulated signals and the optical noise signals based on the plurality of coupled signals; and
  generating a digital signal representative of the plurality of analog input electrical signals based on the plurality of phase differences.

12. The method of claim 11, further comprising:
  generating a plurality of decision signals based on limiting the generated plurality of phase differences using a corresponding plurality of clock signals; and
  generating the digital signal representative of the plurality of analog input electrical signals based on the plurality of decision signals.

13. The method of claim 12, wherein the plurality of clock signals are generated by a single clock generator and are phase-correlated with each other.

14. The method of claim 11, wherein the multiplexing of the plurality of coupled signals onto the single optical transmission medium uses Wave Division Multiplexing (WDM) or Dense Wave Division Multiplexing (DWDM).

15. The method of claim 11, further comprising:
  receiving the plurality of analog input electrical signals from a corresponding plurality of sensor arrays.

16. The method of claim 11, further comprising:
splitting each of the plurality of coupled signals to generate a corresponding plurality of first coupled signals and a plurality of second coupled signals; and
delaying each of the plurality of second coupled signals to generate a plurality of delayed signals.

17. The method of claim 16, further comprising:
generating the plurality of phase differences between the optical modulated signals and the optical noise signals based on the plurality of first coupled signals and the plurality of delayed signals.

18. A distributive photonic monobit analog-to-digital converter, comprising:
a plurality of signal processing chains configured to receive a corresponding plurality of input complex baseband signals, wherein each processing chain of the plurality of signal processing chains comprises:
an optical source configured to generate an optical noise signal, the optical noise signal comprising random signal phases that are uniformly distributed over a pre-determined range of the optical noise signal;
an optical modulator configured to modulate an input complex baseband signal of the plurality of input complex baseband signals onto an input optical signal to generate an optical modulated signal;
a coupler configured to couple the optical modulated signal with the optical noise signal to generate a coupled signal, the coupled signal having a sour free dynamic range (SFDR) based on the uniformly distributed random signal phases of the optical noise signal;
a coherent detector configured to coherently detect an in-phase (I) signal component and a quadrature (Q) signal component associated with the input complex baseband signal using the coupled signal and a matching reference optical signal;
a limiter configured to output a complex decision signal based on the detected I and Q signal components and using a clock signal;
a multi-phase clock generator configured to generate the clock signal for each of the plurality of signal processing chains; and
a digital signal processing (DSP) circuit configured to generate at least one digital signal representative of the plurality of input complex baseband signals based on the complex decision signal from each of the plurality of signal processing chains.

19. The distributive photonic monobit analog-to-digital converter of claim 18, further comprising:
a laser light source configured to generate the input optical signal; and
a local oscillator (LO) laser configured to generate the reference optical signal for each of the plurality of signal processing chains.

20. A distributive photonic monobit analog-to-digital converter, comprising:
a plurality of signal processing chains configured to receive a corresponding plurality of input complex baseband signals, wherein each processing chain of the plurality of signal processing chains comprises:
an optical source configured to generate an optical noise signal;
an optical modulator configured to modulate an input complex baseband signal of the plurality of input complex baseband signals onto an input optical signal to generate an optical modulated signal;
a coupler configured to couple the optical modulated signal with the optical noise signal to generate a coupled signal;
a multiplexer configured to multiplex a first portion of the coupled signals from the couplers in the plurality of signal processing chains onto a single optical transmission medium using Wave Division Multiplexing (WDM) or Dense Wave Division Multiplexing (DWDM);
a plurality of single fiber lines for transmitting a remaining, second portion of the coupled signals;
a demultiplexer configured to demultiplex the first portion of the coupled signals received via the single optical transmission medium;
a coherent detector configured to coherently detect an in-phase (I) signal component and a quadrature (Q) signal component associated with the input complex baseband signal using the coupled signal and a matching reference optical signal;
a limiter configured to output a complex decision signal based on the detected I and Q signal components and using a clock signal;
a multi-phase clock generator configured to generate the clock signal for each of the plurality of signal processing chains; and
a digital signal processing (DSP) circuit configured to generate at least one digital signal representative of the plurality of input complex baseband signals based on the complex decision signal from each of the plurality of signal processing chains.

* * * * *

UNITED STATES PATENT AND TRADEMARK OFFICE
CERTIFICATE OF CORRECTION

PATENT NO. : 10,700,700 B1
APPLICATION NO. : 16/359234
DATED : June 30, 2020
INVENTOR(S) : Shamee et al.

Page 1 of 1

It is certified that error appears in the above-identified patent and that said Letters Patent is hereby corrected as shown below:

In the Specification

Column 3, Line 44, delete "3302N" and insert --302N-- therefor

Column 4, Line 4, delete "320A, 320B, . . . 320N." and insert --320A, 320B, . . . , 320N.-- therefor Column 4, Line 56, delete "322A, . . . 322N" and insert --322A, . . . , 322N-- therefor Column 4, Lines 66-67, delete "324A, . . . 324N" and insert --324A, . . . , 324N-- therefor In the Claims Column 11, Line 29, Claim 18, delete "sour" and insert --spur-- therefor Signed and Sealed this
Twenty-ninth Day of December, 2020

Andrei Iancu
*Director of the United States Patent and Trademark Office*